(12) United States Patent
Delvaux et al.

(10) Patent No.: US 8,949,085 B2
(45) Date of Patent: Feb. 3, 2015

(54) SYSTEM AND METHOD FOR OBTAINING AND DE-NOISING VIBRATORY DATA

(75) Inventors: John McConnell Delvaux, Fountain Inn, SC (US); Huageng Luo, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 627 days.

(21) Appl. No.: 13/284,381

(22) Filed: Oct. 28, 2011

(65) Prior Publication Data

US 2013/0110476 A1    May 2, 2013

(51) Int. Cl.
| | | |
|---|---|---|
| G06F 7/60 | (2006.01) |
| G06G 7/48 | (2006.01) |
| G01M 7/00 | (2006.01) |
| G01M 5/00 | (2006.01) |
| G01M 7/02 | (2006.01) |
| G01M 7/08 | (2006.01) |
| G06F 17/50 | (2006.01) |
| G01M 15/12 | (2006.01) |

(52) U.S. Cl.
CPC .............. *G01M 7/00* (2013.01); *G01M 5/0066* (2013.01); *G01M 7/022* (2013.01); *G01M 7/08* (2013.01); *G06F 17/5018* (2013.01); *G01M 15/12* (2013.01)
USPC .................................................. 703/2; 703/5

(58) Field of Classification Search
None
See application file for complete search history.

(56) References Cited

U.S. PATENT DOCUMENTS

| | | |
|---|---|---|
| 4,554,836 A | 11/1985 | Rudd |
| 5,106,192 A | 4/1992 | Tucker et al. |
| 6,277,704 B1 | 8/2001 | Reinberg |
| 6,505,130 B1 | 1/2003 | Springer, III et al. |
| 6,972,846 B2 | 12/2005 | Lal et al. |
| 7,116,426 B2 | 10/2006 | Lal et al. |
| 2001/0032514 A1* | 10/2001 | Maruyama ...................... 73/657 |
| 2008/0247659 A1* | 10/2008 | Ramirez et al. ............... 382/252 |
| 2009/0301198 A1* | 12/2009 | Sohn et al. ....................... 73/598 |
| 2011/0119041 A1* | 5/2011 | Daudet et al. ..................... 703/2 |
| 2012/0240682 A1* | 9/2012 | Boon et al. ....................... 73/657 |

OTHER PUBLICATIONS

"Structural Damage Detection Using Laser Vibrometers", Jenal et al. NDT in Aerospace 2010.*
"Measurement of 2D dynamic stress distributions with a 3D-Scanning Laser Doppler Vibrometer", Schussler et al. bMTU Aero Engines GmbH, Component testing, Dachauer Str. 665, 80995 Muenchen, Germany.*
"Development of Three-Dimensional Vibration Measurement System Using Laser Doppler Vibrometers", Miyashita et al. Advances in Experimental Structural Engineering Itoh and Aoki (eds.).*
"Non-Intrusive Shock Measurements using Laser Doppler Vibrometers", Statham, Shannon M. 27th Aerospace Testing Seminar, Oct. 2012.*

* cited by examiner

*Primary Examiner* — Omar Fernandez Rivas
*Assistant Examiner* — Nithya J Moll
(74) *Attorney, Agent, or Firm* — Dority & Manning, PA (57) ABSTRACT

In one aspect, a method for de-noising vibratory data of a test component is disclosed. The method may generally include obtaining data related to a plurality of modeled mode shapes of a finite element model of a test component, obtaining data related to a plurality of experimental mode shapes of the test component from a plurality of non-contact vibration measurement devices and de-noising with a computing device the plurality of experimental mode shapes using the plurality of modeled mode shapes to create a plurality of de-noised mode shapes for the test component.

20 Claims, 4 Drawing Sheets

SYSTEM AND METHOD FOR OBTAINING AND DE-NOISING VIBRATORY DATA

FIELD OF THE INVENTION

The present subject matter relates generally to determining strain distributions for vibrating components and, more particularly, to a system and method for de-noising vibratory data of a vibrating component.

BACKGROUND OF THE INVENTION

In manufacturing airfoils and various other components, relative strain distributions of the airfoils/components must be obtained for quality assurance purposes. Conventionally, such strain distributions have been obtained by positioning strain gauges onto the airfoil/component and performing a lengthy, complicated strain test. However, due to the multiple gauges and/or wires that must be attached to the surface of the airfoil/component, the dynamic characteristics of the airfoil/component may be changed, thereby resulting in strain distributions with significant errors. In addition, the labor costs for performing such strain tests are often prohibitively expensive.

On the other hand, numerical methods for obtaining dynamic mode shape measurements are readily available, which may then be used to determine relative strain by taking spatial derivations of the mode shapes. However, noise in an experimentally obtained mode shape is inevitable. Accordingly, direct spatial derivations will amplify the noise, leading to inaccurate strain calculations.

To remove the noise from experimentally obtained mode shapes, various de-noising methods have been proposed, such as polynomial curve-fitting, Spline, principal component analysis and the like. However, these conventional methods destroy the boundary conditions of the component being tested. As a result, the physics of the problem (corresponding to the mechanical and/or dynamic characteristics of the component) are changed after the use of such methods. This change in physics can lead to a significant error in the "de-noised" mode shape, which is then amplified by taking the derivation of the mode shape in order to obtain vibratory strain.

Accordingly, a system and method for obtaining and accurately de-noising vibratory data of a test component would be welcomed in the technology.

BRIEF DESCRIPTION OF THE INVENTION

Aspects and advantages of the invention will be set forth in part in the following description, or may be obvious from the description, or may be learned through practice of the invention.

In one aspect, the present subject matter discloses a method for de-noising vibratory data of a test component. The method may generally include obtaining data related to a plurality of modeled mode shapes of a finite element model of a test component, obtaining data related to a plurality of experimental mode shapes of the test component from a plurality of non-contact vibration measurement devices and de-noising with a computing device the plurality of experimental mode shapes using the plurality of modeled mode shapes to create a plurality of de-noised mode shapes for the test component.

In another aspect, the present subject matter discloses a system for obtaining and de-noising vibratory data of a test component. The system may generally include a plurality of non-contact vibration measurement devices configured to detect vibration parameters of the test component as the test component is vibrated. In addition, the system may include a computing device communicatively coupled to the non-contact vibration measurement devices. The computing device may include a finite element model of the test component and may be configured to determine a plurality of experimental mode shapes for the test component based on the vibration parameters and a plurality of modeled mode shapes for the test component based on the finite element model. Moreover, the computing device may be configured to de-noise the experimental mode shapes using the modeled mode shapes to create a plurality of de-noised mode shapes for the test component.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In general, the present subject matter is directed to a system and method for obtaining and/or de-noising vibratory data of a vibrating test component. Specifically, the present subject matter discloses the use of vibration measurement devices (e.g., laser Doppler vibrometers) to obtain experimental mode shapes for a test component. A finite element analysis may also be used to obtain modeled mode shapes for an electronic model of the test component. The experimental mode shapes may then be projected onto the subspace spanned by the modeled mode shapes to identify the noise or other contamination inevitably contained within the experimental mode shapes. As such, due to the fact that the modeled mode shapes satisfy the geometric and force boundary conditions of the test component, the experimental mode shapes may be de-noised without altering the overall mechanics and/or dynamics of the original problem, thereby allowing for very accurate strain distributions to be calculated for the test component.

Figure 1:
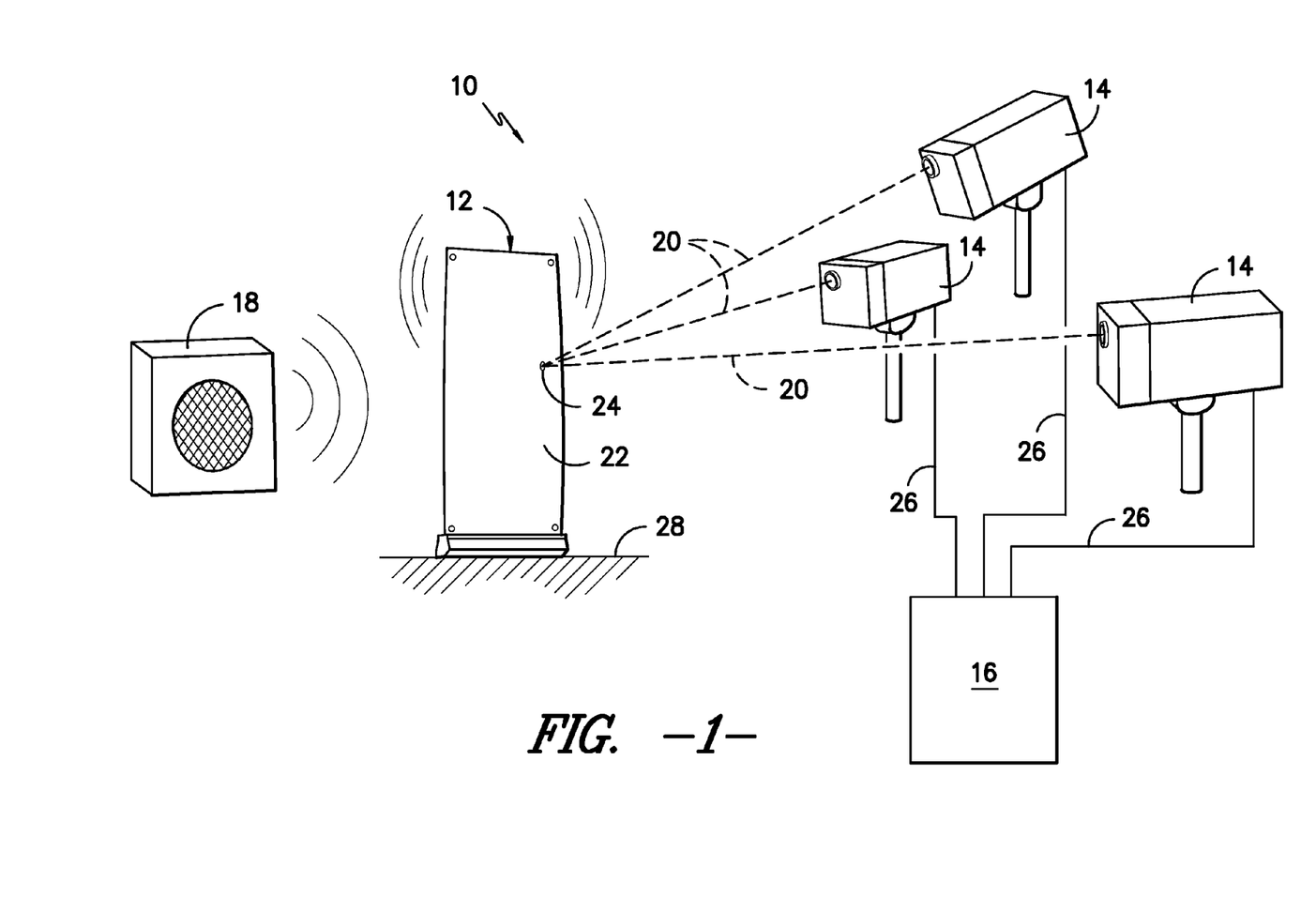
FIG. 1 illustrates a simplified, partial view of one embodiment of a test system for obtaining and de-noising vibratory data of a vibrating test component.

Referring now to the drawings, FIG. 1 illustrates a simplified, partial view of one embodiment of a test system 10 for obtaining and de-noising vibratory data for a vibrating test component 12. As shown, the system 10 generally includes a plurality of vibration measurement devices 14 configured to detect and/or measure one or more vibration parameters of the test component 12. The system 10 also includes a computing device 16 communicatively coupled to the vibration measurement devices 14 and one or more excitation devices 18 configured to excite/vibrate the test component 12.

The vibration measurement devices 14 may generally comprise any suitable measurement devices (contact or non-contact) known in the art that are capable of detecting a vibration parameter of the test component 12 (e.g., velocity and/or displacement) as it is vibrated by the excitation device 18. In several embodiments, the vibration measurement devices 14 may comprise non-contact vibration measurement devices. For instance, each vibration measurement device 14 may comprise a laser Doppler vibrometer (LDV). As is generally understood, LDVs may provide non-contact vibration measurements by directing a beam of coherent light (e.g., a laser beam) towards a particular point on the surface of a vibrating component. The Doppler shift in the frequency of the light scattered by the vibrating component may then be detected by the LDV, from which a time-resolved measurement of the velocity and/or displacement of the vibrating component at the particular point may be obtained. Thus, as shown in FIG. 1, in several embodiments, each vibration measurement device 14 may be configured to direct a beam of coherent light 20 towards a surface 22 of the test component 12 and then detect the Doppler shift in the frequency of the light 20 caused by the vibratory motion of the test component 12. By detecting such Doppler shifts, the velocity and/or displacement of the vibrating test component 12 as it vibrates may be determined.

It should be appreciated by those of ordinary skill in the art that an LDV may generally provide vibration measurements corresponding to the directional component of the velocity and/or displacement of the test component 12 in a direction parallel to the direction of the beam of light 20 (i.e., in a direction perpendicular to the surface 22 of the test component 12 at the particular point 24 at which the beam of light 20 is directed). Thus, in several embodiments, the system 10 may include three or more vibration measurement devices 14 (e.g., three or more LDVs) disposed at differing positions relative to the test component 12 to permit vibration measurements to be obtained in three or more directions simultaneously. For example, as shown in FIG. 1, the system 10 includes three vibration measurement devices 14 spaced apart from one another and oriented relative to the test component 12 such that the devices 14 may direct beams of light 20 towards a single point 24 on the surface 22 of the test component 12 from three different directions. As such, each vibration measurement device 14 may be configured to detect one directional component of the velocity vector ($V_x$, $V_y$, $V_z$) and/or the displacement vector ($X_x$, $X_y$, $X_z$) of the test component 12 as it vibrates, thereby providing a three-dimensional vibration measurement for the test component 12 at the single point 24. Once sufficient vibratory data has been obtained at the single point 24 (e.g., after the test component 12 has been vibrated through a range of excitation frequencies), the beams of light 20 may then be directed towards another point on the surface 22 of the test component 12 to allow further three-dimensional vibration measurements to be obtained at such point.

Referring still to FIG. 1, each vibration measurement device 14 may be communicatively coupled to the computing device 16 to permit the vibration data obtained by the vibration measurement devices 14 to be transmitted to the computing device 16 for subsequent processing, storage and/or analysis. For example, as shown in the illustrated embodiment, each vibration measurement devices 14 is coupled to the computing device 16 via a wired connection, such as by using one or more communicative cables 26. However, in alternative embodiments, the vibration measurement devices 14 may be communicatively coupled to the computing device 16 through a wireless connection using any suitable wireless communications protocol.

In general, the computing device 16 may comprise any suitable computer, processing unit or combination of computers and/or processing units. Thus, in several embodiments, the computing device 16 may include one or more processor(s) (not shown) and associated memory device(s) (not shown) configured to perform a variety of computer-implemented functions. As used herein, the term "processor" refers not only to integrated circuits referred to in the art as being included in a computer, but also refers to a controller, a microcontroller, a microcomputer, a programmable logic controller (PLC), an application specific integrated circuit, and other programmable circuits. Additionally, the memory device(s) may generally comprise memory element(s) including, but are not limited to, computer readable medium (e.g., random access memory (RAM)), computer readable non-volatile medium (e.g., a flash memory), a floppy disk, a compact disc-read only memory (CD-ROM), a magneto-optical disk (MOD), a digital versatile disc (DVD) and/or other suitable memory elements. Such memory device(s) may generally be configured to store suitable computer-readable instructions that, when implemented by the processor(s), configure the computing device 16 to perform various functions including, but not limited to, storing/processing vibratory data/measurements received from the vibration measurement devices 14, creating a finite element model of the test component 12, performing a finite element analysis of the model, performing the calculations and/or analyses described herein and/or the like)

Additionally, the computing device 16 may also include a communications module (not shown) to facilitate communications between the computing device 16 and the other components of the disclosed system 10 (e.g., the vibration measurement devices 14, the excitation device 18 and/or the like). For instance, the communications module may include a sensor interface (e.g., one or more analog-to-digital converters) to permit the signals transmitted by the vibration measurement devices 14 to be converted into signals that can be understood and processed by the processors. For example, in one embodiment, the output of each vibration measurement device 14 may be a continuous analog signal that is directly proportional to the directional component of the velocity and/or displacement of the test component 12 in a direction parallel to the direction of the beam of light 22. In such an embodiment, the sensor interface may be configured to receive the analog signals from the vibration measurement devices 14 and convert such signals to digital signals that can be used by the computing device 16.

Referring still to FIG. 1, the excitation device 18 may generally comprise any suitable device and/or energy source configured to excite/vibrate the test component 12. In several embodiments, the excitation device 18 may comprise a non-contact device so as to minimize the influence of the excitation device 18 on the test component 12. For example, as shown in FIG. 1, the excitation device 18 comprises a speaker configured to excite/vibrate the test component 12 by emitting sound waves at differing excitation frequencies.

It should be appreciated that the excitation device 18 may be configured to receive an excitation signal (e.g., a signal corresponding to the frequency at which the excitation device 18 is to excite/vibrate the test component 12) from any suitable source. For instance, in one embodiment, the excitation device 18 may be communicatively coupled to the computing device 16 (via a wired or wireless connection) such that excitation signals generated by the computing device 16 may be transmitted to the excitation device. Alternatively, the excitation device 18 may be coupled to any other source (e.g., a vibrometer control unit) capable of generating excitation signals. It should also be appreciated that the excitation signals may be transmitted to the excitation device 18 using any suitable excitation algorithm, such as random, periodic chirp, single tone dwell, multiple tone simultaneous excitations and/or the like.

Additionally, it should be appreciated that, although the test component 12 is shown in FIG. 1 as being configured as an airfoil component for a gas turbine (e.g., a turbine nozzle or bucket), the test component 12 may generally comprise as any suitable component for which vibratory data is desired to be obtained. Moreover, as shown in the illustrated embodiment, the test component 12 is mounted and/or coupled to a test stand 28 for the purpose of obtaining the vibration measurements. However, due to the flexibility provided by using non-contact vibration measurement devices 14 (e.g., LDVs), the vibration measurements may also be obtained in the field (in situ) while the test component 12 is in its typical operating environment. For example, the non-contact vibration measurement devices 14 may be used to obtain vibration measurement of a turbine nozzle and/or a turbine bucket while such component(s) is within an operating gas turbine.

Figure 2:
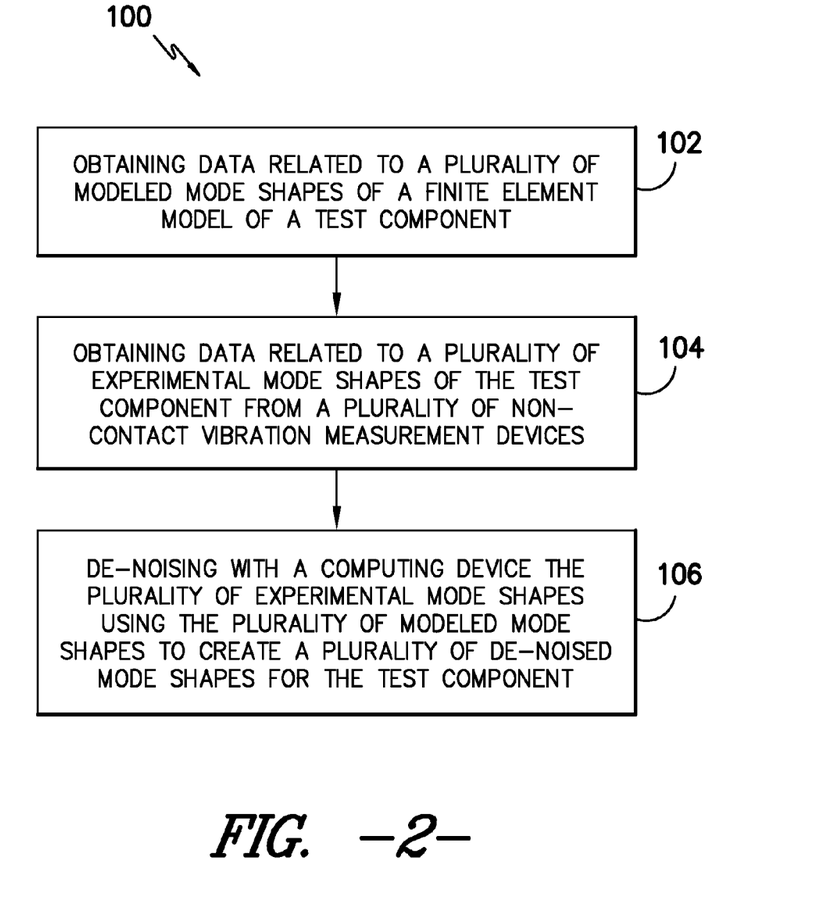
FIG. 2 illustrates a flow diagram of one embodiment of a method for de-noising vibratory data of a vibrating test component.

Referring now to FIG. 2, a flow diagram of one embodiment of a method 100 for de-noising vibratory data of a vibrating test component is illustrated in accordance with aspects of the present subject matter. As shown, the method 100 generally includes obtaining data related to a plurality of modeled mode shapes of a finite element model of a test component 102, obtaining data related to a plurality of experimental mode shapes of the test component from a plurality of non-contact vibration measurement devices 104 and de-noising with a computing device the plurality of experimental mode shapes using the plurality of modeled mode shapes to create a plurality of de-noised mode shapes for the test component 106.

A particular embodiment of the disclosed method 100 will be described in detail below with reference to the flow diagram 200 of FIG. 3. However, in general, the method 100 may permit experimentally obtained vibratory data to be accurately de-noised without altering the fundamental mechanics and dynamics of the test component, thereby allowing more precise strain calculations to be obtained for the test component. Specifically, by creating and/or obtaining a finite element model of the test component that has the same or similar geometry as the test component and that satisfies or substantially satisfies the boundary conditions of the test component, a finite element modal analysis may be performed to obtain modeled mode shapes for the test component. Similarly, be performing an experimental modal analysis of the test component (e.g., by using the test system 10 described above with reference to FIG. 1), experimental mode shapes for the test component may be obtained. The experimental mode shapes may then be projected onto the subspace spanned by the modeled mode shapes, as will be described in greater detail below, to determine what portion of the experimentally obtained mode shapes is actually attributable to vibration of the test component and what portion is attributable to noise or other contamination.

Figure 3:
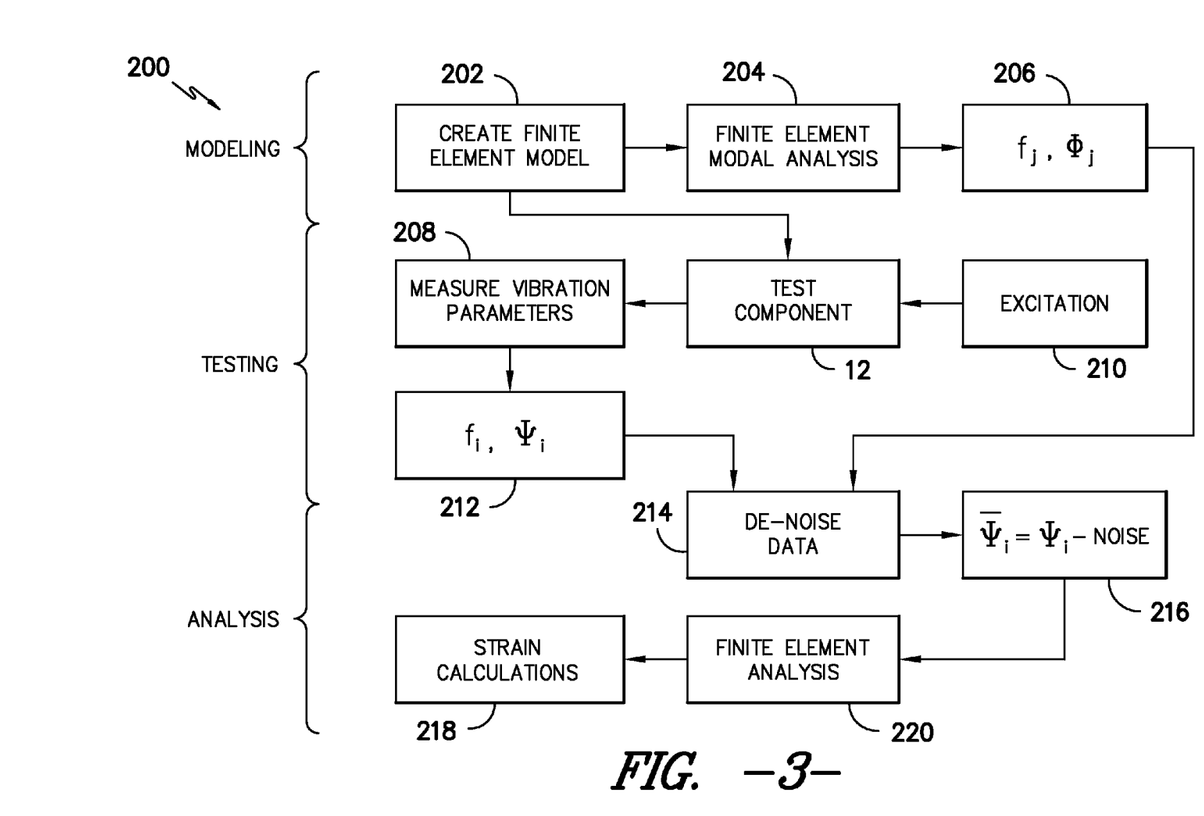
FIG. 3 illustrates one example of a flow chart for performing a particular embodiment of the method shown in FIG. 2.

Referring now to FIG. 3, one example of a flow chart 200 for performing a particular embodiment of the disclosed method 100 is illustrated in accordance with aspects of the present subject matter. As shown, the flow chart 200 is divided into three sections (modeling, testing, and analysis), with each section including one or more boxes representing steps that may be performed during the performance of the disclosed method 100, data that may be obtained during the performance of the disclosed method 100 and/or the like. However, it should be appreciated that the particular division of the flow chart 200 and the particular order of the boxes shown in FIG. 3 are provided for discussion purposes only to provide one example of the disclosed method 100.

As shown in FIG. 3, in box 202, a finite element model of the component to be tested (i.e., the test component 12) may be created. In general, the finite element model may correspond to an electronic, three-dimensional model having the same or similar geometry as the test component 12. For example, in several embodiments, the finite element model may have the same nominal geometry as the test component 12 (i.e., by having dimensions that fall within the manufacturing tolerances of the test component 12). Additionally, the finite element model may be created so as to satisfy or substantially satisfy the boundary conditions of the test component 12. For instance, when the test component 12 is configured as an airfoil component for a gas turbine (e.g., a turbine nozzle or bucket), the finite element model may have three free edges (e.g., around each edge 302 of the airfoil 300 (FIG. 4)) and one fixed edge (e.g., at the platform/root 304 (FIG. 4) at which the airfoil 300 is coupled to the turbine rotor). Moreover, the material properties of the test component 12 (e.g., poison's ratio, Young's modulus, material density and/or the like) may also be input into the finite element model.

It should be appreciated that, in several embodiments, the finite element model of the test component 12 may be created on the computing device 16 described above using any suitable modeling software stored therein. Alternatively, the model may be created on another device and then transferred to the computing device 16 for subsequent processing, storage and/or analysis. For instance, the model may be established by scanning the test component 12 using a coordinate-measuring machine (CMM) or by extracting the nominal geometry of the test component 12 from an existing database (e.g., a manufacturer's database).

Additionally, as shown in FIG. 3, in box 204, a modal analysis may be conducted on the finite element model using the computing device 16 and/or any other suitable processing unit. In general, the modal analysis may be conducted using any suitable finite element analysis software known in the art, such as ANSYS simulation software and/or the like. As is generally understood, a finite element modal analysis may be used to determine the various modes of vibration of an object. Thus, as shown in box 206, upon performing the finite element modal analysis, the natural mode shapes ($\Phi_j$) and modal frequencies ($f_j$) of the finite element model may be obtained, with each mode shape ($\Phi_j$) and modal frequency ($f_j$) corresponding to a different mode of vibration for the finite element model (i.e., modes 1, . . . j, . . . n).

Referring still to FIG. 3, in addition to conducting a finite element modal analysis to obtain modeled mode shapes ($\Phi_j$) for the test component 12, an experimental modal analysis may also be conducted to obtain experimental mode shapes for the test component 12. In several embodiments, the experimental modal analysis may be conducted using the test system 10 described above with reference to FIG. 1. Thus, the vibration measurement devices 14 may be utilized to detect and/or measure one or more vibration parameters of the test component 12 (box 208 in FIG. 3) as it is excited/vibrated (box 210 in FIG. 3) by the excitation device 18.

Figure 4:
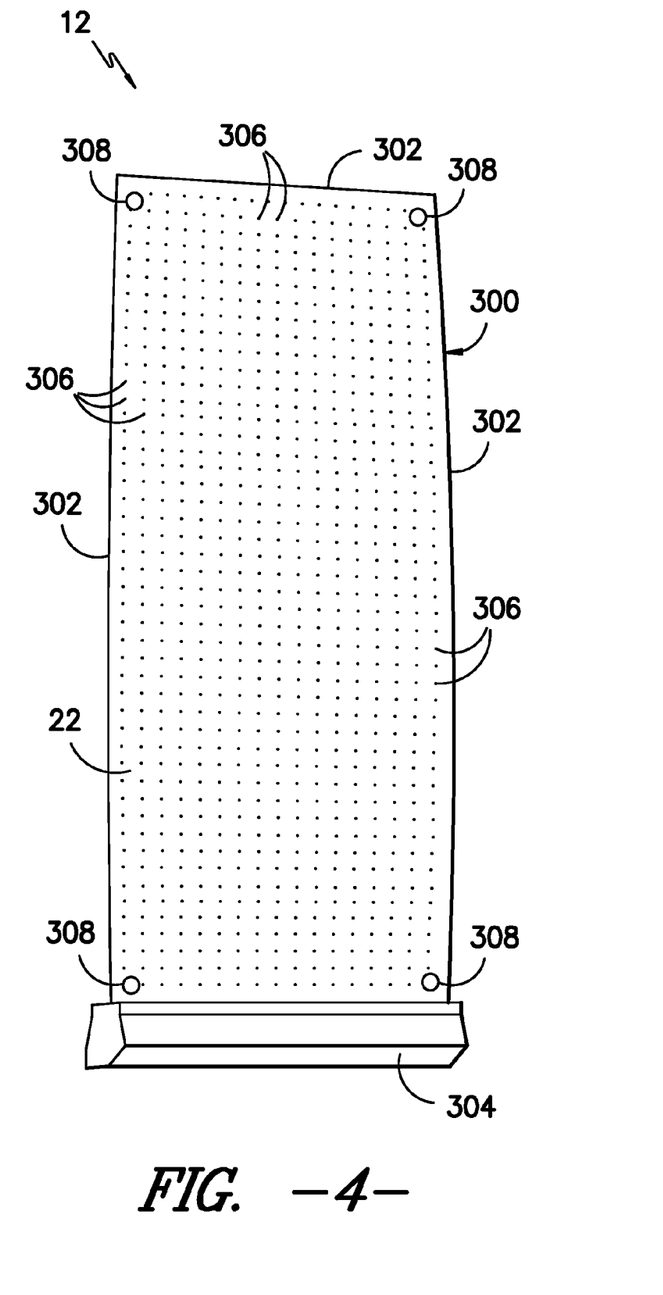
FIG. 4 illustrates an enlarged, perspective view of test component shown in FIG. 1.

As indicated above, the vibration measurement devices 14 may be configured to take three-dimensional vibration parameter measurements (e.g., velocity and/or displacement in three directions) at one or more locations along the surface 22 (FIG. 1) of the test component 12, such as by directing three or more beams of light 20 at a particular point 24 on the surface 22 of the test component 12 and detecting a Doppler shift in the light caused by the vibration of the test component 12. For instance, FIG. 4 illustrates an enlarged, perspective view of the test component 12 shown in FIG. 1. As shown, in several embodiments, the vibration measurement devices 14 may be configured to take vibration parameter measurements at a plurality of different measurement points 306 spaced apart along the surface 22 of the test component 12 (e.g., the concave, pressure side surface of the airfoil 300). In one embodiment, the location and/or spacing of measurement points 306 along the surface 22 may correspond to a node mesh of the finite element model. For instance, the vibration measurement devices 14 may comprise suitable LDVs or other measurement devices capable receiving and/or uploading the node mesh from an external source (e.g., the computing device 16). In such an embodiment, each measurement point 306 may correspond to a finite element node of the finite element model. As a result, the vibration parameter measurements taken at each measurement point 306 may be matched with the modeled vibration data obtained from the finite element modal analysis for each corresponding finite element node.

It should be appreciated that, when importing and/or loading the finite element node mesh into the vibration measurement devices 14, it may be desirable to identify one or more anchor points 308 on the surface 22 of the test component 22 so that the node mesh may be accurately mapped onto the test component 12. For instance, as shown in FIG. 4, anchor points 308 (shown as points of increased diameter) may be identified at the corners of the surface 22 being measured to ensure that the vibration measurements taken at each measurement point 306 may correspond to the modeled vibration data provided for each finite element node.

Additionally, it should be appreciated the excitation device 18 may be configured to excite/vibrate the test component 12 across a range of excitation frequencies as the vibration measurement devices 14 obtain measurement at each measurement point 306. For instance, in several embodiments, the excitation device 18 may be configured to sweep across a range of excitation frequencies that includes all or a portion of the modal frequencies ($f_j$) determined during the finite element modal analysis. As such, experimental mode shapes for the test component 12 may be obtained that correspond to the modeled mode shapes ($\Phi_j$) determined during the finite element modal analysis. Specifically, as shown in FIG. 3, in box 212, by taking vibration parameter measurements at each measurement point 306 when the excitation frequency ($f_j$) is equal to one of the modal frequencies ($f_j$), experimental mode shapes ($\Psi_i$) may be determined for the various modes of vibration of the test component 12 (i.e., modes 1, . . . i, . . . n). Accordingly, for each mode of vibration of the test component 12, experimental and modeled mode shapes ($\Psi_i, \Phi_j$) may be obtained for each measurement point 306 along the surface 22 of the test component 12.

It should be readily understood by those of ordinary skill in the art that the experimental mode shapes ($\Psi_i$) may be determined using the velocity and/or displacement data provided by the vibration measurement devices 14. Such mathematical relationships are well known and, thus, need not be described herein.

Referring still to FIG. 3, as shown in box 214, upon obtaining the experimental and modeled mode shapes ($\Psi_i, \Phi_j$), the experimental mode shapes ($\Psi_i$) may be de-noised using the modeled mode shapes ($\Phi_j$) to determine a plurality of de-noised mode shapes for the test component 12. Specifically, as shown in box 216, the de-noising of the experimental mode shapes ($\Psi_i$) may be expressed by the following equation (equation (1)):

$$\{\bar{\Psi}_i\} = \{\Psi_i\} - \epsilon_i \quad (1)$$

wherein $\{\bar{\Psi}_i\}$ corresponds to the $i^{th}$ de-noised mode shape for the test component (modes 1, . . . , i, . . . n), $\{\Psi_i\}$ corresponds to the $i^{th}$ experimental mode shape for the test component and $\epsilon_i$ corresponds to the noise or contamination in the $i^{th}$ experimental mode shape.

In general, the experimental mode shapes ($\Psi_i$) may be de-noised using any suitable de-noising process that provides for the accurate de-noising of such mode shapes without destroying the boundary conditions of the test component 12. However, in accordance with several embodiments of the present subject matter, the experimental mode shapes ($\Psi_i$) may be de-noised using an eigenfunction subspace projection (SSP) de-noising technique developed by the inventors of the present subject matter. The SSP technique is essentially a parameter estimation de-noising technique. Unlike conventional curve-fitting techniques, the base functions of the SSP (i.e., the modeled mode shapes ($\Phi_j$)) satisfy or substantially satisfy the boundary conditions of the test component 12 (e.g., geometric and force boundary conditions). As a result, the SSP technique provides a means for de-noising vibratory data while maintaining the mechanics/dynamics of the test component (i.e., without changing the physics of the problem). Accordingly, very accurate de-noised mode shapes ($\bar{\Psi}_i$) may be obtained, thereby preventing significant error amplification when the mode shapes are differentiated to obtain a strain distribution for the test component.

The SSP technique is generally based on the theory that eigenfunctions or mode shapes form a complete set. Thus, by using the modeled mode shapes of the test component as a base set $[\Phi] = (\Phi_1, \ldots, \Phi_j, \ldots, \Phi_n)$, the contaminated, experimental mode shapes ($\Psi_i$) may be projected onto the subspace spanned by the base set $[\Phi]$. The residual may then be considered noise or other contamination and can be removed. Specifically, in one embodiment, the experimental mode shapes ($\Psi_i$) may be projected onto the subspace spanned by the base set of modeled mode shapes $[\Phi]$ using the following equation (equation (2)):

$$\{\Psi_i\} \approx \sum_{j=1}^{n} \alpha_{ij}\{\Phi_j\} + \varepsilon_i \quad (2)$$

wherein $\{\Psi_i\}$ corresponds to the $i^{th}$ experimental mode shape for the test component (modes 1, . . . , i, . . . n), $\{\Phi_j\}$ corresponds to the $j^{th}$ modeled mode shape for the test component (modes 1, . . . , j, . . . n), $\alpha_{ij}$ corresponds to the contribution of the $j^{th}$ modeled mode shape on the $i^{th}$ experimental mode shape and $\epsilon_i$ corresponds to the noise or contamination in the $i^{th}$ experimental mode shape.

By utilizing equation (2), the contamination or noise ($\varepsilon_i$) contained within each experimental mode shape ($\Psi_i$) may be determined, which may then be utilized in equation (1) to determine the de-noised mode shapes $\{\overline{\Psi}_i\}$ for the test component 12. As shown above, equation (2) provides an approximate solution for each experimental mode shape ($\Psi_i$). However, it should be appreciated that the accuracy of the mathematical relationship provided in equation (2) increases as the number "n" is increased. Specifically, as the number "n" approaches infinity, it may be said that the experimental mode shapes ($\Psi_i$) are equal to $$\sum_{j=1}^{n} \alpha_{ij}\{\Phi_j\} + \varepsilon_i.$$

It should also be appreciated that the contribution of the $j^{th}$ modeled mode shape on the $i^{th}$ experimental mode shape ($\alpha_{ij}$) may be determined using any suitable mathematical technique known in the art (e.g., any suitable parameter estimation technique). For example, in several embodiments, a least-mean-square parameter estimation technique may be used to determine the contribution of the $j^{th}$ modeled mode shape on the $i^{th}$ experimental mode shape ($\alpha_{ij}$). Specifically, in one embodiment, since the base set $[\Phi]=(\Phi_1, \ldots, \Phi_j, \ldots, \Phi_n)$ is not typically a square matrix, a pseudo-inverse technique may be utilized to determine the least-square solution ($\alpha_{ij}$).

Referring still to FIG. 3, upon de-noising the experimental mode shapes ($\Psi_i$), the de-noised mode shapes $\{\overline{\Psi}_i\}$ may be utilized to determine the relative strain distribution for the test component (in box 218). For example, as shown in the illustrated embodiment, in box 220, the de-noised mode shapes $\{\overline{\Psi}_i\}$ may be input into suitable finite element software such that a finite element analysis may be performed in order to permit the strain distribution for the test component to be calculated. The strain distribution may then be evaluated and/or utilized to perform further analyses/calculations, such as by using the strain distribution to calculate stress distribution on the test component, to perform a modal assurance computation, to compare to the results of a strain gauge test and/or the like.

It should be appreciated by those of ordinary skill in the art that, to determine strain in a three-dimensional test component, displacement and/or velocity of the test component must be obtained in three directions. Thus, the present subject matter has generally been described with reference to the use of three or more vibration measurement devices 14 to allow three-dimensional displacement and/or velocity measurement to be obtained. However, if the test component 12 is two-dimensional, then the strain in the test component 12 may be determined by obtaining displacement and/or velocity measurements in only one direction. In such an embodiment, the test system 10 may only include one vibration measurement device 14 for obtaining vibration parameter measurements of the test component 12.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for de-noising vibratory data of a test component, the method comprising:
    obtaining data related to a plurality of modeled mode shapes of a finite element model of a test component;
    obtaining data related to a plurality of experimental mode shapes of the test component from a plurality of non-contact vibration measurement devices; and
    de-noising with a computing device the plurality of experimental mode shapes using the plurality of modeled mode shapes to create a plurality of de-noised mode shapes for the test component,
    wherein the de-noising is accomplished by projecting the plurality of experimental mode shapes onto a subspace spanned by the plurality of modeled mode shapes to determine the plurality of de-noised mode shapes.

2. The method of claim 1, further comprising determining a strain distribution of the test component using the plurality of de-noised mode shapes.

3. The method of claim 1, wherein obtaining data related to a plurality of experimental mode shapes of a test component from a plurality of non-contact vibration measurement devices comprises obtaining the data from at least three laser Doppler vibrometers.

4. The method of claim 1, wherein obtaining data related to a plurality of experimental mode shapes of a test component from a plurality of non-contact vibration measurement devices comprises measuring a vibration parameter with each of the plurality of non-contact vibration measurement devices at a plurality of different measurement points along a surface of the test component.

5. The method of claim 4, wherein measuring a vibration parameter with each of the plurality of non-contact vibration measurement devices at a plurality of different locations along a surface of the test component comprises:
    directing beams of light from at least three non-contact vibration measurement devices towards a particular location along the surface of the test component; and
    detecting changes in the light as the light is scattered from the particular location using the at least three non-contact vibration measurement devices.

6. The method of claim 4, wherein the plurality of different measurement points corresponds to a node mesh of the finite element model.

7. The method of claim 4, wherein the vibration parameter comprises at least one of a velocity measurement and a displacement measurement.

8. The method of claim 1, wherein projecting the plurality of experimental mode shapes onto a subspace spanned by the plurality of modeled mode shapes comprises projecting the plurality of experimental mode shapes onto the subspace spanned by the plurality of modeled mode shapes using the following equations:

$$\{\overline{\Psi}_i\} = \{\Psi_i\} - \varepsilon_i$$

$$\{\Psi_i\} \approx \sum_{j=1}^{n} \alpha_{ij}\{\Phi_j\} + \varepsilon_i$$

wherein, $\{\Psi_i\}$ corresponds to the $i^{th}$ experimental mode shape, $\{\overline{\Psi}_i\}$ corresponds to the $i^{th}$ de-noised mode shape, $\varepsilon_i$ corresponds to contamination in the $i^{th}$ experimental mode shape, $\{\Phi_j\}$ corresponds to the $j^{th}$ modeled mode shape and $\alpha_{ij}$ corresponds to the contribution of the $j^{th}$ modeled mode shape on the $i^{th}$ experimental mode shape.

9. The method of claim 8, further comprising determining using a least-mean-square parameter estimation technique.

10. The method of claim 1, wherein the finite element model has the same nominal geometry as the test component and at least substantially satisfies the boundary conditions of the test component.

11. A system for obtaining and de-noising vibratory data of a test component, the system comprising:
a plurality of non-contact vibration measurement devices configured to detect vibration parameters of the test component as the test component is vibrated; and
a computing device communicatively coupled to the plurality of non-contact vibration measurement devices and including a finite element model of the test component, the computing device being configured to determine a plurality of experimental mode shapes for the test component based on the vibration parameters and a plurality of modeled mode shapes for the test component based on the finite element model,
wherein the computing device is further configured to de-noise the plurality of experimental mode shapes using the plurality of modeled mode shapes to create a plurality of de-noised mode shapes for the test component,
wherein the plurality of experimental mode shapes are de-noised by projecting the plurality of experimental mode shapes onto a subspace spanned by the plurality of modeled mode shapes.

12. The system of claim 11, wherein the computing device is further configured to determine a strain distribution of the test component using the plurality of de-noised mode shapes.

13. The system of claim 11, wherein the plurality of non-contact vibration measurement devices comprises at least three laser Doppler vibrometers.

14. The system of claim 11, wherein the plurality of non-contact vibration measurement devices are spaced apart from one another such that each non-contact vibration measurement device detects vibration parameters of the test component in a different direction.

15. The system of claim 11, wherein the vibration parameter comprises at least one of a velocity measurement and a displacement measurement.

16. The system of claim 11, wherein the computing device is configured project the plurality of experimental mode shapes onto the subspace spanned by the plurality of modeled mode shapes using the following equations:

$$\{\overline{\Psi}_i\} = \{\Psi_i\} - \varepsilon_i$$

$$\{\Psi_i\} \approx \sum_{j=1}^{n} \alpha_{ij}\{\Phi_j\} + \varepsilon_i$$

wherein, $\{\Psi_i\}$ corresponds to the $i^{th}$ experimental mode shape, $\{\overline{\Psi}_i\}$ corresponds to the $i^{th}$ de-noised mode shape, $\varepsilon_i$ corresponds to contamination in the $i^{th}$ experimental mode shape, $\{\Phi_j\}$ corresponds to the $j^{th}$ modeled mode shape and $\alpha_{ij}$ corresponds to the contribution of the $j^{th}$ modeled mode shape on the $i^{th}$ experimental mode shape.

17. The system of claim 11, further comprising an excitation device configured to vibrate the test component.

18. The system of claim 11, wherein the finite element model has the same nominal geometry as the test component and at least substantially satisfies the boundary conditions of the test component.

19. The system of claim 11, wherein the plurality of non-contact vibration measurement devices is configured to detect vibration parameters at a plurality of different measurement points along a surface of the test component, each of the plurality of measurement points corresponding to a node of the finite element model.

20. A system for obtaining and de-noising vibratory data of a test component, the system comprising:
a plurality of non-contact vibration measurement devices configured to detect vibration parameters of the test component as the test component is vibrated; and
a computing device communicatively coupled to the plurality of non-contact vibration measurement devices and including a finite element model of the test component, the computing device being configured to determine a plurality of experimental mode shapes for the test component based on the vibration parameters and a plurality of modeled mode shapes for the test component based on the finite element model,
wherein the computing device is further configured to de-noise the plurality of experimental mode shapes using the plurality of modeled mode shapes to create a plurality of de-noised mode shapes for the test component, the plurality of experimental mode shapes being de-noised using the following equations:

$$\{\overline{\Psi}_i\} = \{\Psi_i\} - \varepsilon_i$$

$$\{\Psi_i\} \approx \sum_{j=1}^{n} \alpha_{ij}\{\Phi_j\} + \varepsilon_i$$

wherein, $\{\Psi_i\}$ corresponds to the $i^{th}$ experimental mode shape, $\{\overline{\Psi}_i\}$ corresponds to the $i^{th}$ de-noised mode shape, $\varepsilon_i$ corresponds to contamination in the $i^{th}$ experimental mode shape, $\{\Phi_j\}$ corresponds to the $j^{th}$ modeled mode shape and $\alpha_{ij}$ corresponds to the contribution of the $j^{th}$ modeled mode shape on the $i^{th}$ experimental mode shape.

* * * * *